(12) United States Patent  
Zwadlo

(10) Patent No.: US 9,315,062 B2  
(45) Date of Patent: Apr. 19, 2016

(54) SYSTEM FOR PRINTING LINES

(71) Applicant: Gregory L. Zwadlo, River Falls, WI (US)

(72) Inventor: Gregory L. Zwadlo, River Falls, WI (US)

(73) Assignee: EASTMAN KODAK COMPANY, Rochester, NY (US)

( * ) Notice: Subject to any disclaimer, the term of this patent is extended or adjusted under 35 U.S.C. 154(b) by 0 days.

(21) Appl. No.: 14/299,312

(22) Filed: Jun. 9, 2014

(65) Prior Publication Data

US 2015/0352834 A1 Dec. 10, 2015

(51) Int. Cl.
| | |
|---|---|
| *B41F 5/24* | (2006.01) |
| *B41M 1/04* | (2006.01) |
| *B41N 1/12* | (2006.01) |
| *B41F 31/00* | (2006.01) |

(52) U.S. Cl.
CPC .. *B41M 1/04* (2013.01); *B41F 5/24* (2013.01); *B41F 31/00* (2013.01)

(58) Field of Classification Search
CPC .............. B41F 5/24; B41M 1/04; B41N 1/06; B41N 1/12; B41C 1/05; H01L 51/0004; H01L 51/0022
See application file for complete search history.

(56) References Cited

U.S. PATENT DOCUMENTS

| | | | |
|---|---|---|---|
| 5,492,730 A | 2/1996 | Balaba et al. | |
| 5,527,562 A | 6/1996 | Balaba et al. | |
| 5,719,009 A | 2/1998 | Fan | |
| 5,798,202 A | 8/1998 | Cushner et al. | |
| 5,804,353 A | 9/1998 | Cushner et al. | |
| 6,090,529 A | 7/2000 | Gelbart | |
| 6,159,659 A | 12/2000 | Gelbart | |
| 6,343,550 B1 * | 2/2002 | Feesler | 101/376 |
| 6,511,784 B1 | 1/2003 | Hiller et al. | |
| 7,026,012 B2 | 4/2006 | Chen et al. | |
| 7,799,504 B2 | 9/2010 | Zwadlo et al. | |
| 7,811,744 B2 | 10/2010 | Figov | |
| 7,947,426 B2 | 5/2011 | Figov et al. | |
| 7,981,719 B2 | 7/2011 | Shukla et al. | |
| 8,114,572 B2 | 2/2012 | Landry-Coltrain et al. | |
| 8,142,987 B2 | 3/2012 | Ali et al. | |
| 8,153,347 B2 | 4/2012 | Veres et al. | |
| 8,187,793 B2 | 5/2012 | Regan et al. | |
| 8,212,243 B2 | 7/2012 | Shukla et al. | |
| 8,399,177 B2 | 3/2013 | Stolt et al. | |
| 2002/0136969 A1 | 9/2002 | Hiller et al. | |
| 2003/0129530 A1 | 7/2003 | Leinenbach et al. | |

(Continued)

FOREIGN PATENT DOCUMENTS

WO 2013/188379 12/2013

OTHER PUBLICATIONS

A.N. Gent, "On the Relation Between Indentation Hardness and Young's Modulus", Rubber Chemistry and Technology: Sep. 1958, vol. 31, No. 4, pp. 896-906.

*Primary Examiner* — Matthew G Marini  
*Assistant Examiner* — Leo T Hinze  
(74) *Attorney, Agent, or Firm* — Nelson A. Blish; David A. Novais

(57) ABSTRACT

A system for printing lines of no more than 20 microns on a receiver element (70) includes a laser for forming a series of pixel features on a flexographic plate. The pixel features form a relief pattern of non-overlapping or discontinuous raised pixel features on the elastomeric relief element (60). An inking system applies a printable material composition (20) to the flexographic plate. A print roller for transfers a printable material composition to flexographic plate.

11 Claims, 13 Drawing Sheets

(56) References Cited

U.S. PATENT DOCUMENTS

| | | |
|---|---|---|
| 2003/0136285 A1 | 7/2003 | Telser et al. |
| 2003/0180636 A1 | 9/2003 | Kanga et al. |
| 2004/0003734 A1 | 1/2004 | Shively et al. |
| 2008/0230773 A1 | 9/2008 | Dickey et al. |
| 2008/0233280 A1 | 9/2008 | Blanchet et al. |
| 2008/0233489 A1 | 9/2008 | Blanchet et al. |
| 2009/0076217 A1 | 3/2009 | Gommans et al. |
| 2009/0218310 A1 | 9/2009 | Zu et al. |
| 2010/0143841 A1* | 6/2010 | Stolt et al. ............ 430/270.1 |
| 2011/0183462 A1 | 7/2011 | Shukla et al. |
| 2011/0269967 A1 | 11/2011 | Shukla et al. |
| 2012/0122664 A1 | 5/2012 | Shukla et al. |
| 2012/0207935 A1 | 8/2012 | Shukla et al. |
| 2012/0237871 A1 | 9/2012 | Zwadlo |
| 2012/0240802 A1 | 9/2012 | Landry-Coltrain et al. |
| 2014/0047992 A1 | 2/2014 | Ramakishnan |
| 2014/0087139 A1 | 3/2014 | Rowley et al. |
| 2015/0122138 A1* | 5/2015 | Van Ostrand et al. ...... 101/216 |

* cited by examiner

FIG. 2A (Prior Art)        FIG. 2B
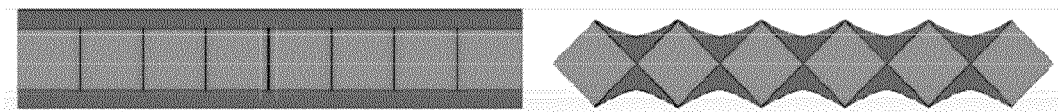
FIG. 2C
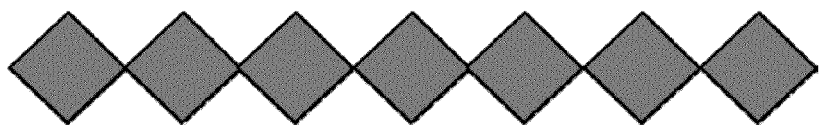
FIG. 2D
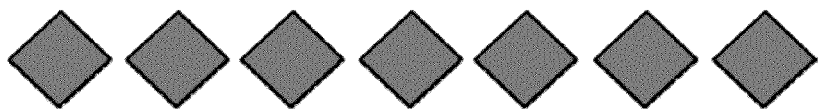
FIG. 3A (Prior Art)        FIG. 3B
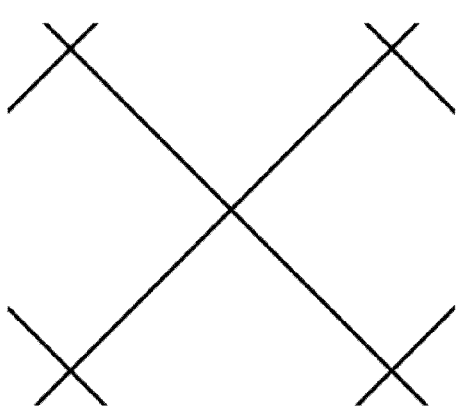
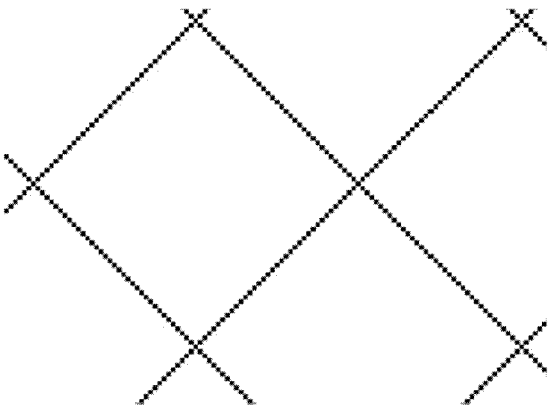

FIG. 4A (Prior Art)
FIG. 4B
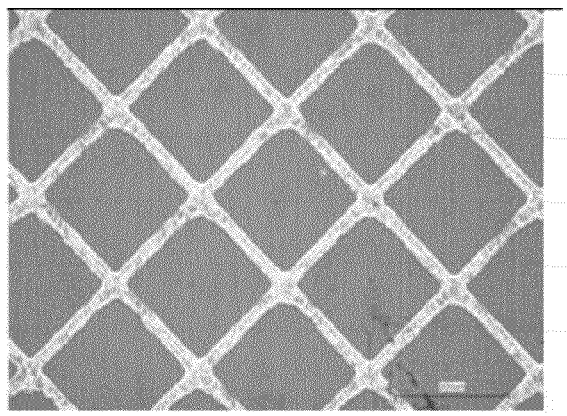
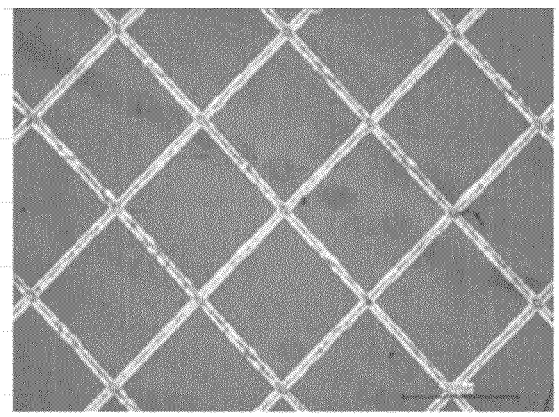
FIG. 5A (Prior Art)  FIG. 5B  FIG. 5C  FIG. 5D  FIG. 5E
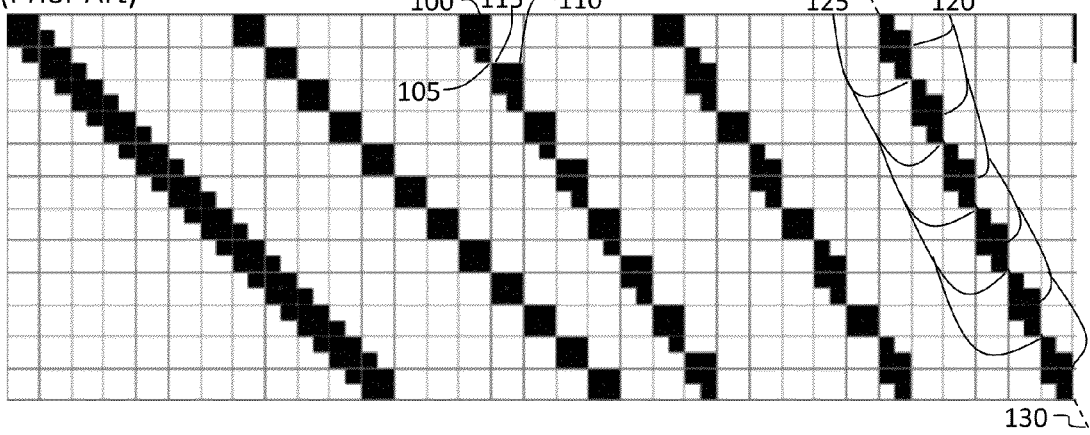
FIG. 6A (Prior Art)  FIG. 6B (Prior Art)  FIG. 6C
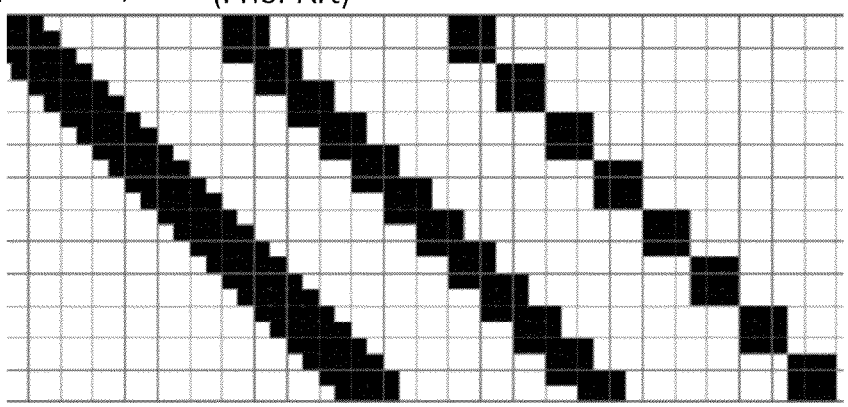

FIG. 9A
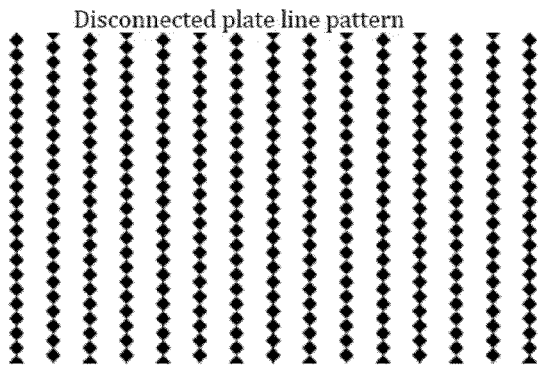
FIG. 9B (Prior Art)
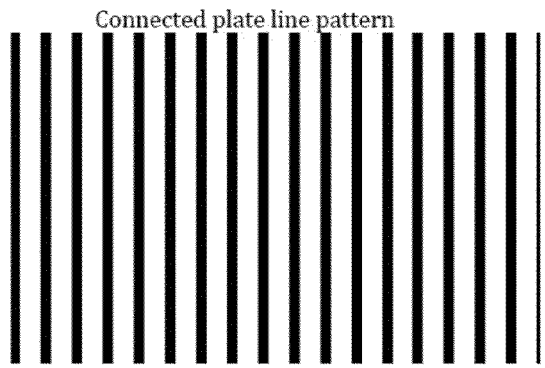
FIG. 9C
FIG. 9D (Prior Art)
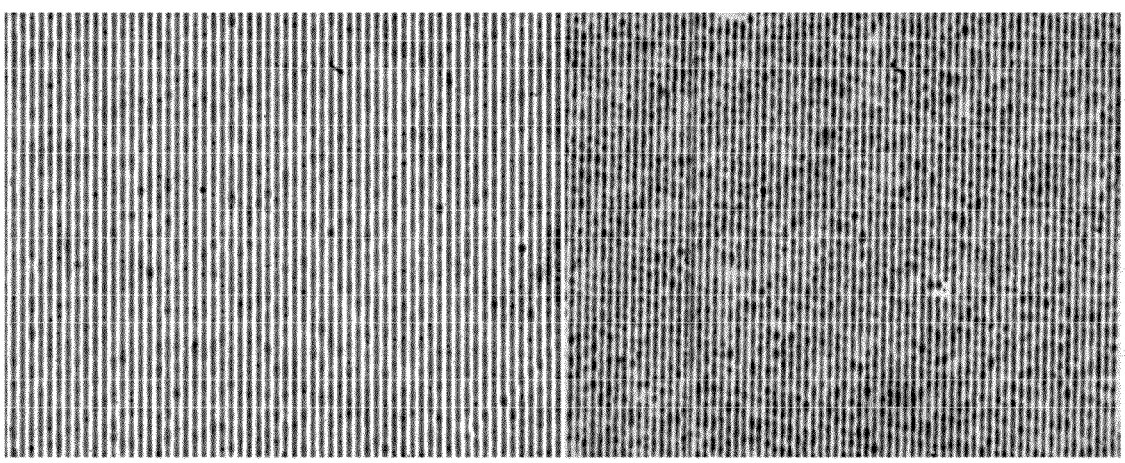
FIG. 9E
FIG. 9F (Prior Art)
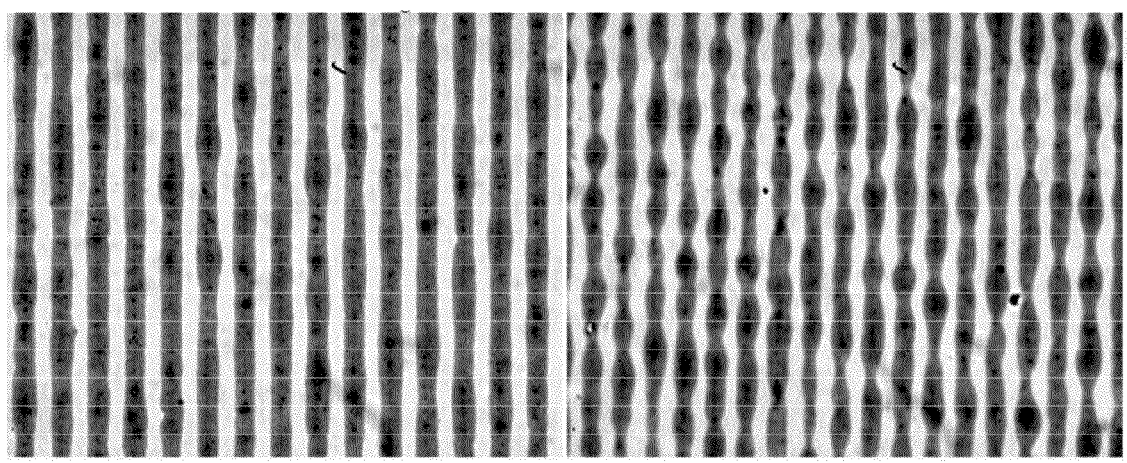

SYSTEM FOR PRINTING LINES

CROSS REFERENCE TO RELATED APPLICATIONS

Reference is made to commonly-assigned copending U.S. patent application Ser. No. 14/299,292, filed Jun. 9, 2014, entitled REDUCING PRINT LINE WIDTH ON FLEXO PLATES, by Zwadlo; the disclosure of which is incorporated herein.

FIELD OF THE INVENTION

This invention relates in general to printing and in particular to flexographic printing of a printable material composition onto a suitable receiver element to provide a printed pattern of thin continuous lines.

BACKGROUND OF THE INVENTION

Relief images can be provided and used in various articles for many different purposes. For example, the electronics, display, and energy industries rely on the formation of coatings and patterns of conductive materials to form circuits on organic and inorganic substrates. Such coatings and patterns are often provided using relief imaging methods and relief image forming elements. There is also need for means to provide fine wiring in various articles.

Microelectronic devices have been prepared by photolithographic processes to form necessary patterns. Photolithography, however, is a complex, multi-step process that is too costly for the printing of electronic devices on plastic substances.

Contact printing is a flexible, non-lithographic method for forming patterned materials. Contact printing potentially provides a significant advance over conventional photolithographic techniques since contact printing can form relatively high resolution patterns for electronic parts assembly. Microcontact printing can be characterized as a high resolution technique that enables patterns of micrometer dimensions to be imparted onto a substrate surface. Contact printing is a possible replacement to photolithography in the fabrication of microelectronic devices, such as radio frequency tags (RFID), sensors, and memory and back panel displays. The capability of microcontact printing to transfer a self-assembled monolayer (SAM) forming molecular species to a substrate has also found application in patterned electroless deposition of metals. SAM printing is capable of creating high resolution patterns, but is generally limited to forming metal patterns of gold or silver, for example, using thiol chemistry. Although there are variations, in SAM printing a positive relief pattern provided on an element having a relief image is inked onto a substrate.

Flexography is a one method of printing or pattern formation that is commonly used for high-volume printing runs. It is usually employed for printing on a variety of soft or easily deformed materials including but not limited to, paper, paperboard stock, corrugated board, polymeric films, fabrics, metal foils, glass, glass-coated materials, flexible glass materials, and laminates of multiple materials. Coarse surfaces and stretchable polymeric films are economically printed using flexography.

Flexographic printing members are sometimes known as "relief" printing members, for example, relief-containing printing plates, printing sleeves, or printing cylinders, and are provided with raised relief images onto which ink is applied for application to a printable material. While the raised relief images are inked, the relief "floor" should remain free of ink. These flexographic printing precursors are generally supplied with one or more imageable layers that can be disposed over a backing layer or substrate. Flexographic printing also can be carried out using a flexographic printing cylinder or seamless sleeve having the desired relief image.

A method of producing a relief image for flexographic printing is described in U.S. Pat. No. 8,142,987 (Ali et al.) and a method for printing with a conductive ink using a relief printing plate at high print speed is described in U.S. Publication No. 2004/0003734 (Shively et al.). U.S. Pat. No. 7,026,012 (Chen et al.) describes a method for transferring catalytic particles from a stamp to a substrate followed by plating the catalytic particles.

U.S. Publication No. 2008/0233280 (Blanchet et al.) describes the use of an elastomeric stamp having a relief structure with a raised surface that is treated with heat or by other means to enhance its wettability, to transfer a functional material to form a pattern on a substrate.

While there are numerous methods described in the art to form patterns using relief images, there remains a need to find a way to consistently provide patterns with high resolution lines, for example, 20 μm or less and feature uniformity using various printable material compositions, which are sometimes known as "inks" The industry has been pursuing these goals for many years with limited success and continued research is being done to achieve these goals using a wide variety of print materials. A number of problems must be addressed to achieve the desired high resolution lines.

The present invention addresses one or more of these problems and provides an improved method for printing a conductive relief image in a pattern with thin continuous lines.

SUMMARY OF THE INVENTION

The present invention provides a system for printing lines of no more than 20 microns on a receiver element includes a laser for forming a series of pixel features on a flexographic plate. The pixel features form a relief pattern of non-overlapping or discontinuous raised pixel features on the elastomeric relief element. An inking system applies a printable material composition to the flexographic plate. A print roller for transfers a printable material composition to flexographic plate.

This invention also provides an elastomeric relief element that comprises a relief pattern comprising (1) an uppermost relief surface, and (2) an average relief image depth of at least 50 microns relative to the uppermost relief surface, and further comprising a series of non-overlapping or discontinuous raised plate pixel features on the elastomeric relief element.

The method of this invention provides a number of advantages for what can be known as "functional printing." For example, the method provides a means for obtaining high resolution printed patterns on various substrates (or receiver elements) using catalytic or electrically conductive print materials. The high resolution line features in printed patterns are obtained by using a series of non-overlapping or discontinuous raised plate pixel features on the elastomeric relief element. The invention and its objects and advantages will become more apparent in the detailed description of the preferred embodiment presented below.

BRIEF DESCRIPTION OF THE DRAWINGS

The above and other features and advantages of the present invention will become more apparent when taken in conjunction with the following description and drawings wherein identical reference numerals have been used to designate identical features that are common to the figures, and wherein:

FIG. 2A is a schematic illustration of the flow of extra ink on a substrate transferred from an elastomeric relief element line pattern of the prior art.

FIG. 2B is a schematic illustration of the flow of extra ink on a substrate transferred from an embodiment of an elastomeric relief element line pattern useful for carrying out the method of the present invention.

FIG. 2C is a schematic illustration of an embodiment of a continuous, connected fine pixel line pattern on an elastomeric relief element useful for carrying out the method of the present invention.

FIG. 2D is a schematic illustration of an embodiment of a discontinuous, connected fine pixel line pattern on an elastomeric relief element useful for carrying out the method of the present invention.

FIG. 3A is a schematic illustration of an embodiment of a fine pixel line pattern on an elastomeric relief element of the prior art.

FIG. 3B is a schematic illustration of an embodiment of a fine pixel line pattern on an elastomeric relief element useful for carrying out the method of the present invention, as described in the Examples below.

FIG. 4A is a schematic illustration of a printed ink line pattern on a transparent substrate using an elastomeric relief element of the prior art.

FIG. 4B is a schematic illustration of a printed ink line pattern on a transparent substrate using an elastomeric relief element useful for carrying out the method of the present invention.

FIG. 5A is a schematic illustration of an embodiment of a two pixel overlapping bitmap pattern used to image an elastomeric relief element of the prior art.

FIG. 5B is a schematic illustration of an embodiment of a two pixel non-overlapping bitmap pattern used to image an elastomeric relief element useful for carrying out the method of the present invention.

FIG. 5C is a schematic illustration of another embodiment of a two pixel non-overlapping bitmap pattern used to image an elastomeric relief element useful for carrying out the method of the present invention.

FIG. 5D is a schematic illustration of another embodiment of a two pixel non-overlapping bitmap pattern used to image an elastomeric relief element useful for carrying out the method of the present invention.

FIG. 5E is a schematic illustration of another embodiment of a two pixel non-overlapping bitmap pattern used to image an elastomeric relief element useful for carrying out the method of the present invention.

FIG. 6A is a schematic illustration of an embodiment of a three pixel overlapping bitmap pattern used to image an elastomeric relief element of the prior art.

FIG. 6B is a schematic illustration of another embodiment of a three pixel overlapping bitmap pattern used to image an elastomeric relief element of the prior art.

FIG. 6C is a schematic illustration of another embodiment of a three pixel non-overlapping bitmap pattern used to image an elastomeric relief element useful for carrying out the method of the present invention.

FIG. 9A is a schematic illustration of an embodiment of a non-overlapping bitmap pattern featuring a series of narrow lines with a 15 micron pitch used to image an elastomeric relief element useful for carrying out the method of the present invention.

FIG. 9B is a schematic illustration of an embodiment of a connected bitmap pattern featuring a series of narrow lines with a 15 micron pitch used to image an elastomeric relief element useful for carrying out the method of the prior art.

FIG. 9C is an optical micrograph at 100× magnification illustrating the narrow line patterns obtained with the non-overlapping bitmap pattern of FIG. 9A of the present invention.

FIG. 9D is an optical micrograph at 100× magnification illustrating the narrow line patterns obtained with the connected bitmap pattern of FIG. 9B of the prior art.

FIG. 9E is an optical micrograph at 400× magnification illustrating the narrow line patterns obtained with the non-overlapping bitmap pattern of FIG. 9A of the present invention.

FIG. 9F is an optical micrograph at 400× magnification illustrating the narrow line patterns obtained with the connected bitmap pattern of FIG. 9B of the prior art.

DETAILED DESCRIPTION OF THE INVENTION

Definitions

Figure 1:
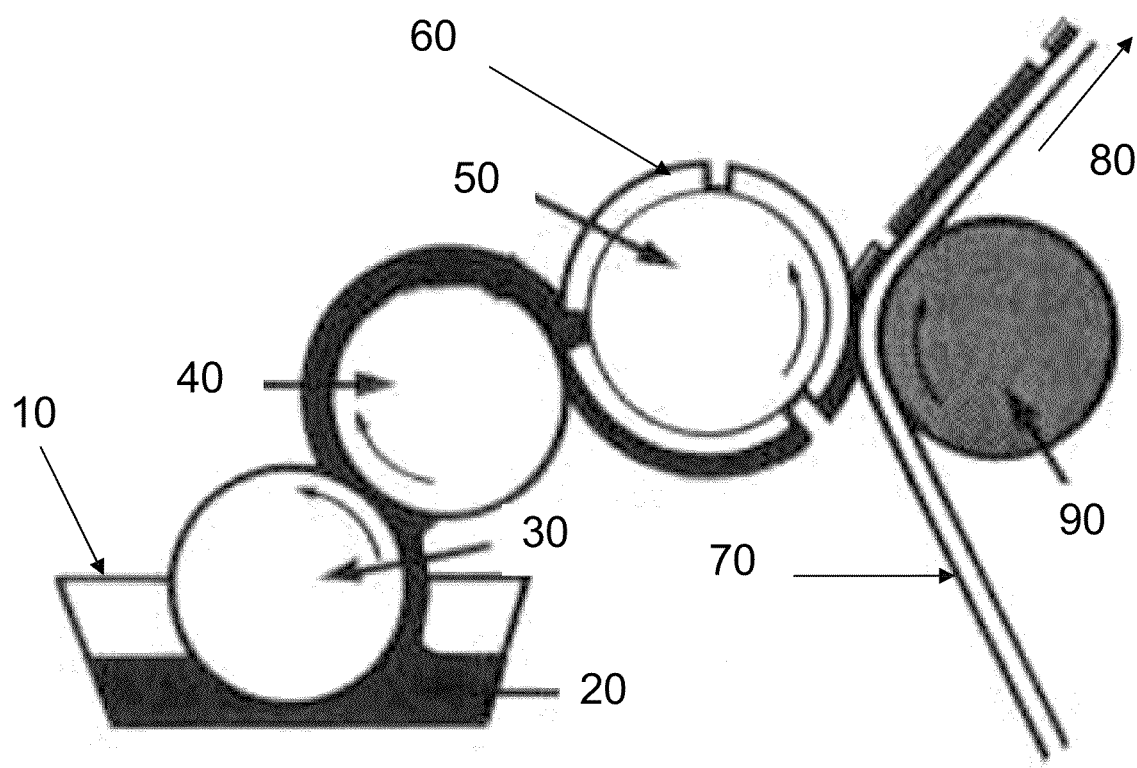
FIG. 1 is a schematic illustration of an embodiment of an equipment system useful for carrying out the method of the present invention.

As used herein to define various components of the printable material compositions, formulations, and elastomeric compositions, unless otherwise indicated, the singular forms "a", "an", and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term definition should be taken from a standard dictionary.

The use of numerical values in the various ranges specified herein, unless otherwise expressly indicated, are considered to be approximations as though the minimum and maximum values within the stated ranges were both preceded by the word "about." In this manner, slight variations above and below the stated ranges can be used to achieve substantially the same results as the values within the ranges. In addition, the disclosure of these ranges is intended as a continuous range including every value between the minimum and maximum values.

Unless otherwise indicated, percentages refer to percents by total dry weight, for example, weight percent based on total solids of a layer, composition, or formulation. Unless otherwise indicated, the percentages can be the same for either the dry layer or the total solids of the formulation or composition used to make that layer.

The term "non-overlapping" refers to a pixel or cluster of pixels in a bitmap pattern used to image an elastomeric relief element that are arranged such that only the corners of the pixels or pixel clusters are adjacent to one another.

The term "cluster" refers to a group of pixels in a bitmap pattern used to image an elastomeric relief element that are arranged such that at least one side of a pixel is adjacent to a side of another pixel. Examples include diamond or hexagonal or triangular or rectangular or other geometric shapes.

The term "discontinuous" refers to the discrete relief structures of the uppermost relief surface of an elastomeric relief element that are arranged such that their surfaces are not in contact with adjacent relief structures.

The term "flexographic printing precursor" refers to some embodiments of elastomeric relief elements useful in the practice of this invention. The flexographic printing precursors include flexographic printing plate precursors, flexographic printing sleeve precursors, and flexographic printing cylinder precursors, all of which can be suitably imaged to provide a relief image to have an average relief image depth of at least 50 µm and up to and including 1000 µm, or at least 100 µm and up to and including 600 µm, relative to the uppermost relief surface. Any desired minimum and maximum relief image depths can be achieved based on a given elastomeric relief element and the printed pattern that is desired. Such elastomeric relief elements can also be known as "flexographic printing plate blanks," "flexographic printing cylinder blanks," or "flexographic sleeve blanks" The elastomeric relief elements can also have seamless or continuous forms.

The term "laser-engraveable" means that a layer can be directly imaged using a suitable laser-engraving source including carbon dioxide lasers and near-infrared radiation lasers such as Nd:YAG lasers, laser diodes, and fiber lasers. Absorption of energy provided by these lasers produces heat that causes rapid local changes in a laser-engraveable layer so that the imaged regions are physically detached from the rest of the layer or substrate and ejected from the layer and collected using suitable means. Non-imaged regions of the laser-engraveable layer are not removed or volatilized to an appreciable extent and thus form the uppermost relief surface in the printing surface for printing. The breakdown is a violent process that includes eruptions, explosions, tearing, decomposition, fragmentation, oxidation, or other destructive processes that create a broad collection of solid debris and gases. "Laser-ablative" and "laser-engraveable" can be used interchangeably in the art, but for purposes of this invention, the term "laser-engraveable" is used to define imaging in which a relief image is formed in the elastomeric relief element. It is distinguishable from image transfer methods in which ablation is used to materially transfer pigments, colorants, or other image-forming components.

Uses

The method of this invention can be used in many ways to form a pattern of a print material on a suitable receiver element (or substrate) for use in devices and for components in a variety of applications including but not limited to, electronic, optical, sensory, and diagnostic devices. More details of such uses are provided below. A variety of active and inactive materials useful as the print material can be applied to the receiver material using a suitable elastomeric relief element described herein. In particular, it is desired to use the present invention to provide patterns of print materials on receiver elements comprising lines having a line resolution (line width) of less than 20 µm, or less than 15 µm, or even less than 10 µm and as low as 1 µm.

Such electronic and optical devices and components include but are not limited to, radio frequency tags (RFID), sensors, and memory and back panel displays. The method of this invention can be used to form patterns of electrically conductive materials, semi-conductive materials, dielectric materials, and colorants (dyes or pigments). The patterns can be designed to be temperature-sensitive or pressure-sensitive as well.

For example, the method of this invention can be used to form suitable patterns of biological materials and pharmacologically active materials on a receiver element for use in sensory or diagnostic applications. The method can also form the print material into a suitable pattern that forms barrier walls for cells or pixels to contain other materials, such as light emitting materials or color filter pigmented materials, or to form a pattern that defines the channel length between source electrodes and drain electrode delivered from solution. The pattern of barrier walls can also be referred to as a confinement layer or barrier layer. The method of this invention can be used to form a print material into a pattern that forms barrier walls that create cells for use as color filter pixels that can be filled with colorants for color filters, including dye and pigment colorants.

The present invention can also be used to form a pattern of a print material into transistor channels for top gate devices in which other materials, such as source materials and drain materials, are delivered to the channels. The method can form the print material into transistor channels on a semiconducting layer of the receiver element for bottom gate devices in which source materials and drain materials are delivered to the channels. The other materials can be delivered into patterned cells on a receiver element by any means including ink jetting.

In particular, the present invention is useful for providing electrically conductive patterns on receiver elements that are designed for use as touch panel displays. Such electrically conductive patterns can be provided using print materials, such as electrically conductive metals and metallic salts that are or can be processed or treated in some manner to become electrically conductive. Useful print materials of this type include but are not limited to, silver and silver salts such as silver halides, and silver behenate and other organic silver salts. Such electrically conductive metal patterns can be further processed for example using electroless metal plating.

Print Materials and Printable Material Compositions

In some embodiments, the term "print material" refers to a material that is capable of facilitating an operation in a component or device. In addition, a print material can be a material that can be used for providing visual information as well as purposes other than simply providing visual information. The print material can be an active or inactive material, and can be organic or inorganic in nature. Organic materials can be polymeric materials or non-polymeric small molecules, or oligomeric materials that are considered to be in between polymeric materials and non-polymeric small molecules.

"Active print materials" include but are not limited to, electrically active materials, photoactive materials, and biologically active materials. As used herein, the terms "electrically active," "photoactive," and "biologically active" refer to print materials that exhibit a predetermined activity in response to a stimulus such as an electromagnetic field, an electrical potential, solar or other energy radiation, a bio-stimulation field, or any combination thereof.

"Inactive print materials" include but are not limited to, insulating materials such as dielectric materials, planarization materials, barrier materials, and confinement materials. For example, a planarization material can be printed on top of a pattern of pixels in color filters to render all pixels the same height. A barrier material is a printed pattern that forms a barrier so that charges in the cathode facilitate charge injection into a light emitting polymer layer in an organic light emitting diode (OLED). A confinement material can be printed as a pattern that restricts the expansion of a subsequently applied liquid to a particular area that is defined by the pattern of confinement material.

Print materials include for example, electrically conductive materials, semi-conductive materials, and dielectric materials. Examples of electrically conductive materials include but are not limited to, conductive polymers, nanoparticles of indium-tin oxide, metals such as gold, silver and silver precursors, copper, and palladium, metal complexes, metal alloys, and combinations thereof. A print material can alternatively be a conductive material precursor such as a metal salt (for example a silver salt like a silver halide or an organic silver salt), or an electroless metallization catalyst such as palladium particles. Examples of useful electrically semi-conductive inorganic materials include but are not limited to silicon, germanium, gallium arsenide, zinc oxide, and zinc selenide, and combinations thereof.

Examples of useful electrically semi-conductive organic materials that can be used as print materials include N,N'-di(arylalkyl)-substituted naphthalene-based tetracarboxylic diimide compounds as described for example in U.S. Pat. No. 7,981,719 (Shukla et al.), N,N'-cycloalkyl-substituted naphthalene-based tetracarboxylic diimide compounds as described for example in U.S. Pat. No. 8,212,243 (Shukla et al.), and compositions also containing polymer additives as described for example in U.S. Publication No. 2011/0183462 (Shukla et al.), the disclosures of all of which are incorporated herein by reference.

In addition, the photocurable inks described in U.S. Publication No. 2012/0207935 (Shukla et al.), the disclosure of which is incorporated herein by reference, can be used as print materials.

Useful print materials can also be compositions that can be polymerized by photoinitiation such as those described in U.S. Publication No. 2012/0122664 (Shukla et al.), the disclosure of which is incorporated herein by reference.

Further, useful "precursor" print materials are amic acid or amic acid ester compositions as described for example in U.S. Publication No. 2011/0269967 (Shukla et al.) the disclosure of which is incorporated herein by reference.

Print materials can be of any form including particulate, polymeric materials, small molecule materials, and other forms that would be apparent to a skilled worker. For example, useful electrically semi-conductive materials and dielectric materials can be used as particulate print materials. Useful particulate or film-forming polymeric print materials include electrically conductive polymers including but not limited to, homopolymers and copolymers comprising polythiophenes, polyanilines, polypyrroles, polycarbazoles, polyindoles, polyazepines, polyethylenedioxythiophenes, poly (3-alkylthiophenes), poly(p-phenylene vinylene)'s, polypphenylene)'s, poly(styrene sulfonic acid) (PSS), poly(p-phenylene sulfide), polyacetylene, poly(3,4-ethylene dioxythiophene) (PEDOT), and a mixture of poly(styrene sulfonic acid) and poly(3,4-ethylene dioxythiophene) (PSS: PEDOT).

It is also possible that the print materials are nanoparticles of electrically conductive, electrically semi-conductive, and dielectric materials. Nanoparticles are microscopic particles whose size is measured in nanometers (nm). Nanoparticles include particles having at least one dimension less than 200 nm and in some embodiments, the nanoparticles have an average diameter of at least 3 nm to and including 100 nm. The nanoparticles can be in the form of clusters 100, as shown in FIG. 5C. The shape of the nanoparticles is not limited and includes nanospheres, nanorods, and nanocups. Nanoparticles composed of electrically semi-conductive materials can also be known as quantum dots if the particles are small enough (usually less than 30 nm) that quantization of electronic energy levels occurs. Electrically conductive semi-conductive materials include light-emitting quantum dots. The print materials include but are not limited to, semi-solid nanoparticles such as liposomes, soft nanoparticles, nanocrystals, and hybrid structures, such as core-shell nanoparticles. Moreover, the print materials also include nanoparticles of carbon such as carbon black, carbon nanotubes, electrically conducting carbon nanotubes, graphene, carbon black conducting polymers, and electrically semi-conducting nanotubes. Metal nanoparticles and dispersions of gold, silver, and copper are also useful in this invention.

The term "photoactive" print material is intended to mean any print material that exhibits photoluminescence, electroluminescence, or photosensitivity. The term is intended to include at least dyes, optical whiteners, photoluminescent materials, compounds reactive to actinic radiation, and photoinitiators. For example, a photoactive print material can be a material or combination of materials that are capable of initiating one or more reactions, particularly photochemical reactions, upon response to suitable ultraviolet, visible, or infrared radiation. Photoactive print materials can include compounds that can be reactive to radiation or a composition comprising one or more compounds, such as monomers and photoinitiators that render the composition reactive to the radiation.

Further examples of print materials can be referred to as small molecules and include but are not limited to, organic dyes, electrically semi-conducting molecules, fluorescent chromophores, phosphorescent chromophores, pharmacologically active compounds, biologically active compounds, silver halide compositions, and compounds having catalytic activities, that alone or in various combinations with other materials, are suitable for the fabrication of patterned devices useful for electronic, sensory, or diagnostic applications.

Biologically active print materials, which can also be called bio-based materials, for use in the present invention can include but are not limited to, deoxyribonucleic acids (DNAs) of various molecular weights that can be used as templates or scaffolds to position other materials that bind to DNA into well-defined geometries, and proteins, poly(oligo) peptides, and poly(oligo)saccharides, that alone or in various combinations with other materials, are suitable for the fabrication of patterned devices for electronic, sensory, or diagnostic application.

Thus, in many embodiments, the printable material composition used in this invention comprises a print material that is selected from the group consisting of electrically conductive materials, semi-conductive materials, dielectric materials, small molecule materials, polymeric materials, bio-based materials, electro luminescence materials, and combinations thereof.

More particularly, the printable material composition used in this invention comprises a print material that comprises nanoparticles of an electrically conductive material selected from the group consisting of silver or silver precursor, gold, copper, palladium, indium-tin oxide, or combinations thereof. For example, in some very useful embodiments, the printable material composition comprises a print material that comprises nanoparticles of an inorganic or organic silver salt such as a silver halide, silver behenate, and other silver salts that would be readily apparent to one skilled in the art.

It has been found particularly useful to use printable material compositions comprising a print material that comprises nanoparticles of a silver halide (such as silver chloride, silver bromide, silver chlorobromide, or other silver salts of mixed halides) using an elastomeric relief element (described below) that is a flexographic printing member such as a flexographic printing plate.

In other embodiments, the print material is a colorant including but not limited to, dyes, optical absorbers, pigments, opacifiers, and any material that modifies the transmissive or reflective property of a surface onto which it has been applied.

In general, one or more print materials can be dispersed, dissolved, or suspended in a suitable carrier liquid, forming a printable material composition for application to a receiver material using the elastomeric relief element described herein. The carrier liquid used for the printable material composition is not limited and can include organic compounds and aqueous compounds. For example, the carrier liquid can be an organic compound that is an alcohol-based compound. The carrier liquid can be a solvent that is capable of dissolving another substance such as one or more print materials to form a uniform solution, or it can be a compound capable of dispersing or suspending the print material in solution sufficient to carry out the method of this invention.

The carrier liquid and the print material should at least be capable of wetting at least the uppermost relief surface of the elastomeric relief element during the method of this invention. The carrier liquid can have some volatility, and can also cause a certain amount of swelling in the elastomeric relief element, depending upon the type of composition from which the elastomeric relief element is prepared. Any swelling in the elastomeric relief element can be reduced when the carrier liquid is removed from the printable material composition. In addition, it is advantageous to use a carrier liquid that will not attack or adversely affect the stability and dimensional size of the elastomeric relief element or receiver element. A skilled worker can readily make a judicious choice of carrier liquid depending upon the materials used for the elastomeric relief element and the receiver element, and the particular print material to be printed (is swellability, solubility and other desired properties).

The carrier liquid can also include one or more compounds as a solvent for the print material. For example, the carrier liquid can include one or more solvents for the print material. In other embodiments, the carrier liquid comprises two or more solvents, for example a co-solvent mixture, for the print material. The solvent mixtures can be chosen using various criteria such as the evaporation rate (volatility) of the individual solvents, and the solvating power of the individual solvent components for a particular print material. Further details of such solvents are provided in paragraph [0046] of U.S. Publication No. 2008/0233280 (noted above) the disclosure of which is incorporated herein by reference.

Representative useful carrier liquid solvents include but are not limited to, alcohols (such as isopropyl alcohol, 2-ethyl hexanol, and α-terpenol), acetates (such as ethyl acetate), water, hydrocarbons (such as toluene and cyclohexane), and combinations of miscible solvents.

In general, the printable material composition comprising the carrier liquid and print material has a viscosity of at least 10 cps and up to and including 1500 cps, or typically of at least 200 cps and up to and including 900 cps, or up to and including 1000 cps. Some highly viscous printable material compositions can be used in the practice of this invention, and have a viscosity of at least 1500 cps to and including 5000 cps. Viscosity can be measured using a conventional means and equipment such as a Brookfield Viscometer DV-II+ Pro (Brookfield Engineering Laboratories).

Some particularly useful print materials include but are not limited to, electrically conductive inks containing electrically conductive particles such as metal flakes or particles. Electrically conductive inks include electrically conductive silver-containing inks, gold-containing inks, copper-containing inks, carbon-containing inks, palladium-containing inks, and inks containing "seed" materials for electroplating or electroless plating. Some of such inks can be obtained commercially from sources such as InkTec (California), Flint Ink Corporation (Michigan), and Method Development Company (Chicago). Some of these "inks" can be used as a carrier liquid while other inks comprise both a carrier liquid and a print material. It is also possible to use print materials that contain UV-curable components.

Thus, such printable material compositions (or "inks") can comprise print materials that are dissolved or suspended in suitable carrier solvents as described above and that are known in the art for this purpose. For example, a silver-containing electrically conductive printable material composition can include any useful amount of silver metal particles that are dispersed in aqueous or non-aqueous carrier solvents.

Elastomeric Relief Elements

The elastomeric relief elements useful in the practice of this invention can be comprised of one or more elastomeric layers, with or without a substrate, in which a relief image can be generated using suitable imaging means. For example, the relief layer comprising a relief pattern can be disposed on a suitable substrate.

For example, the elastomeric relief element (for example, flexographic printing member) having a relief layer comprising an uppermost relief surface and an average relief image depth (pattern height) of at least 50 µm, or typically having an average relief image depth of at least 100 µm relative from the uppermost relief surface, can be prepared from imagewise exposure of an elastomeric photopolymerizable layer in an elastomeric relief element precursor such as a flexographic printing member precursor, for example as described in U.S. Pat. No. 7,799,504 (Zwadlo et al.) and U.S. Pat. No. 8,142,987 (Ali et al.) and U.S. Publication No. 2012/0237871 (Zwadlo), the disclosures of which are incorporated herein by reference for details of such precursors. Such elastomeric photopolymerizable layers can be imaged through a suitable mask image to provide an elastomeric relief element (for example, flexographic printing plate or flexographic printing sleeve). In some embodiments, the relief layer comprising the relief pattern can be disposed on a suitable substrate as described in the noted Ali et al. patent. Other useful materials and image formation methods (including development) for provide elastomeric relief images are also described in the noted Ali et al. patent.

In other embodiments, the elastomeric relief element is provided from a direct (or ablation) laser-engraveable elastomer relief element precursor, with or without integral masks, as described for example in U.S. Pat. No. 5,719,009 (Fan), U.S. Pat. No. 5,798,202 (Cushner et al.), U.S. Pat. No. 5,804,353 (Cushner et al.), U.S. Pat. No. 6,090,529 (Gelbart), U.S. Pat. No. 6,159,659 (Gelbart), U.S. Pat. No. 6,511,784 (Hiller et al.), U.S. Pat. No. 7,811,744 (Figov), U.S. Pat. No. 7,947,426 (Figov et al.), U.S. Pat. No. 8,114,572 (Landry-Coltrain et al.), U.S. Pat. No. 8,153,347 (Veres et al.), U.S. Pat. No. 8,187,793 (Regan et al.), and U.S. Publication Nos. 2002/0136969 (Hiller et al.), 2003/0129530 (Leinenback et al.), 2003/0136285 (Telser et al.), 2003/0180636 (Kanga et al.), and 2012/0240802 (Landry-Coltrain et al.).

However the relief image is provided, its elastomeric relief layer is designed such that the elastomeric relief element has a modulus of elasticity of at least two megaPascals but less than ten megaPascals, or typically of at least four megaPascals and up to and including eight megaPascals, as determined for example, using a Digital Durometer HPE-II Series (Qualitest USA LC), Instron Model 5942 Single Column Table Top Materials Testing System, Texture Technologies TA-XT2i Benchtop Materials Tester, or Rheometrics Solids Analyzer Model RSAII DMA, particularly when the elastomeric relief element is a flexographic printing member. The relationship between Shore A hardness (indentation) and Young's Modulus is described by A. N. Gent, "On the Relation between Indentation Hardness and Young's Modulus", Rubber Chemistry and Technology: September 1958, Vol. 31, No. 4, pp. 896-906.

As noted above, average relief image depth (relief pattern) or an average relief pattern height in the relief pattern is at least 50 µm or typically at least 100 µm relative to the uppermost relief surface. A maximum relief image depth (relief pattern) or relief pattern height can be as great as 1,000 µm, or typically up to and including 750 µm, relative to the uppermost relief surface. The relief pattern generally has a shoulder angle of greater than 25° and up to and including 85°, or typically at least 50° and up to but less than 75°, relative to a vertical line from the lowest recess to the uppermost relief surface (that is, the higher should angle of 85° would be closer to the horizontal dimension parallel with the uppermost relief surface). Shoulder angle can be measured as described in FIG. 4 of U.S. Pat. No. 7,799,504, the disclosure of which is incorporated herein by reference for details of this measurement.

Methods for Forming Patterns

The method of this invention includes the provision of an elastomeric relief element described herein to print a suitable pattern of a print material on a receiver element. The present invention enables printing of a variety of print materials over relatively large areas with desirable resolution (for example, a line width of less than 20 µm or even less than 15 µm). In some embodiments, the resolution (line width) can be as low as 5 µm or even as low as 1 µm. The method also provides a means for printing of sequential overlying patterns without hindering the utility of one or more underlying layers. The method can be adapted to high-speed production processes for the fabrication of electronic devices and components.

The printable material compositions containing the print material can applied in a suitable manner to the uppermost relief surface (raised surface) in the elastomeric relief element. Application of the printable material composition can be accomplished using several suitable means and it is desirable that as little as possible is coated onto the sides (slopes) or recesses of the relief depressions. Thus, it is desirable that as much as possible of the printable material composition is applied only to the uppermost relief surface. Anilox roller systems or other roller application systems, especially low volume Anilox rollers, below 2.5 billion cubic micrometers per square inch (6.35 billion cubic micrometers per square centimeter) and associated skive knives are used in flexographic printing presses are particularly advantageous for this application of the printable material composition. Spin coating techniques and dip coating techniques are generally not suitable for this application because the printable material composition can be spread onto the sides of the elastomeric relief element relief features and even onto the floor or non-printing areas of the elastomeric relief element. Optimum metering of the printable material composition onto the uppermost relief surface only can be achieved by controlling the printable material composition viscosity or thickness, or choosing an appropriate application means.

As noted above, the printable material composition can have a viscosity during this application of at least 10 cps (centipoise) and up to and including 1500 cps, or at least 100 cps to and up to and including 1000 cps.

The printable material composition can be applied at any time after the relief image is formed within a relief element precursor. The printable material composition can be applied by any suitable means, including the use of an Anilox roller system, which can be one of the most useful ways for application to the uppermost relief surface. The thickness of the functional material composition on the relief image is generally limited to a sufficient amount that can readily be transferred to the receiver element but not too much to flow over the edges of the relief element in the recesses when the functional material composition is applied to the relief element.

The printable material composition is transferred from the uppermost relief surface to a receptive surface of a receiver element. A receiver element is provided on which a desired pattern is formed using the elastomeric relief element. This receiver element can be composed of any suitable material including but are not limited to, polymeric films, metals, silicon or ceramics, fabrics, papers, and combinations thereof (such as laminates of various films, or laminates of papers and films) provided that a pattern of a print material can be formed from the printable material composition on at least one receptive surface thereof. The receiver element can be transparent or opaque, and rigid or flexible. The receiver element can include one or more polymeric or non-polymeric layers or one or more patterns of other materials before the pattern of print material is applied according to the present invention. A surface of the receiver element can be treated for example with a primer layer or electrical or mechanical treatments (such as graining) to render that surface a "receptive surface" to achieve suitable adhesion of the print material or of a separate adhesive layer.

In most embodiments, the receiver element comprises a separate receptive layer as the receptive surface disposed on a substrate, which receptive layer and substrate can be composed of a material such as a suitable polymeric material that is highly receptive of the printable material composition.

A surface of the substrates can be treated by exposure to corona discharge, mechanical abrasion, flame treatments, or oxygen plasmas, or by coating with various polymeric films, such as poly(vinylidene chloride) or an aromatic polysiloxane as described for example in U.S. Pat. Nos. 5,492,730 and 5,527,562 (both to Balaba et al.) and U.S. Publication No. 2009/0076217 (Gommans et al.), to make that surface more receptive to the printable material composition.

Suitable substrates in the receiver elements include but are not limited to, metallic films or foils, metallic films on polymer, glass, or ceramic supports, metallic films on electrically conductive film supports, semi-conducting organic or inorganic films, organic or inorganic dielectric films, or laminates of two or more layers of such materials. For example, useful substrates can include indium-tin oxide coated glass, indium-tin oxide coated polymeric films, poly(ethylene terephthalate) films, poly(ethylene naphthalate) films, polyimide films, polycarbonate films, polyacrylate films, polystyrene films, polyolefin films, polyamide films, silicon, metal foils, cellulosic papers or resin-coated or glass-coated papers, glass or glass-containing composites, ceramics, metals such as aluminum, tin, and copper, and metalized films. The receiver element substrate can also include one or more charge injection layers, charge transporting layers, and semi-conducting layers on which the printable material composition pattern is formed.

Particularly useful substrates are polyesters films such as poly(ethylene terephthalate), polycarbonate, or poly(vinylidene chloride) films that have been surface-treated as noted above, or coated with one or more suitable adhesive or subbing layers, the outer layer being receptive to the printable material composition. A useful outer layer can be a vinylidene chloride polymer containing layer.

Useful substrates can have a desired dry thickness depending upon the eventual use of the receiver element, for example its incorporation into various articles or devices (for example optical devices or optical panels). For example, the dry thickness can be at least 0.001 micron and up to and including 10 micron, and especially for polymeric films, the dry thickness can be at least 0.008 micron and up to and including 0.2 micron.

The receiver element and the print material disposed on the uppermost relief surface of the elastomeric relief element are contacted such that the elastomeric relief element is compressed by at least 10 µm of its original thickness ("compression distance") or at least 50 µm and up to and including 200 µm of the original thickness. This original thickness is that of only the elastomeric relief element, and does not include any supporting means or surface, such as mounting tape, underneath the elastomeric relief element. The total thickness of the elastomeric relief element can be at least 0.4 millimeter or even at least 2 millimeter. The compression distance is generally greater for thicker elastomeric relief elements. The numbers noted above are generally for elastomeric relief elements having a total thickness of 1.14 millimeter.

The transfer pressure can be applied to either the elastomeric relief element or the receiver element to assure contact and complete transfer of the printable material composition to the receiver element. For example, transfer of the printable material composition can be carried out by moving the uppermost relief surface of the elastomeric relief element relative to the receiver element, by moving the receiver element relative to the uppermost relief surface of the elastomeric relief element, or by relative movement of both elements to each other.

In some embodiments, the printable material composition is transferred to the receiver element manually. In other embodiments, the transfer is automated such as by example, by a conveyor belt, reel-to-reel process, directly driven moving fixtures, chain, belt, or gear-driven fixtures, frictional roller, printing press, or rotary apparatus, or any combination of these methods.

In general, transferring the print material from the raised uppermost relief surface of the elastomeric relief element to the receiver element creates a pattern of the print material on the receiver element. The transferring can be referred to as "printing." The pattern of the print material on the receiver element can comprise lines, solid areas, dots, or a mixture of lines and solid areas in any desired pattern that text, numbers, shapes, or other images, or combinations thereof. In general, the average line width for printed lines in a pattern on the receiver element can be less than 20 µm or even less than 15 µm and as wide as 2 µm. Such lines can also have an average height of at least 10 nm and up to and including 4,000 µm. These average dimensions can be determined by measuring the lines in at least 10 different places and determining the width or height using known image analysis tools including but not limited to, profilometry, optical microscopic techniques, atomic force microscopy, and scanning electron microscopy.

While a particularly useful method of applying the print material to the receiver element include the use of flexography and the elastomeric relief element is a flexographic printing member comprising a relief image, the print material composition can also be applied to a receiver element using alternative appropriate printing methods that would be readily apparent to one skilled in the art using the teaching provided herein.

The method of this invention can be carried out at room temperature such as at least 17° C. to and including 30° C. but is not so limited, and can be carried out at a lower temperature down to about 5° C. or at an elevated temperature up to 50° C. provided that the heat does not harm the elastomeric relief element, the print material, the receiver element, or their ability to form a pattern on the receiver element.

In some of the embodiments, the method of this invention provides a printed pattern of fine lines of a print material containing a seed material for a subsequent electroless plating process. For example, for copper electroless plating, such seed materials include but are not limited to, metals such as palladium, tin, nickel, platinum, iridium, rhodium, and silver, or a mixture of tin and palladium.

For example, the method of this invention can be used to provide a pattern of a print material that is protective of an underlying uniform metal film during a subsequent etching process.

In other embodiments, the method of this invention can be used to provide a pattern of fine lines of a print material having an electrical conductivity that is high enough for a subsequent electroplating process. Such an electrical conductivity is at least 0.1 S/cm and the details of such processes are known in the art.

After the pattern of print material has been applied to the receiver element in a suitable manner, the pattern can be further treated if desired using heat or exposure to actinic radiation (such as UV, visible, or IR radiation). For example, if the print material contains metal nanoparticles, the pattern of print material can be heated to sinter the particles and render the pattern lines or shapes conductive. Sintering provides a coherent bonded mass from heating a metal powder in the form of metal nanoparticles, without melting. Sintering can be carried out using temperatures and conditions that would be apparent to one skilled in the art. The pattern of print material can alternatively be chemically treated to change its properties, such as conductivity, color, or reflectivity using conditions, materials, and procedures that would be readily apparent to one skilled in the art.

The present invention provides at least the following embodiments and combinations thereof, but other combinations of features are considered to be within the present invention as a skilled artisan would appreciate from the teaching of this disclosure.

In one embodiment, a pattern of continuous lines is formed with a line width of 20 microns or less of a printable material composition on a receiver element. The relief pattern is a series of non-overlapping or discontinuous raised pixel features. The printable material composition is applied to the uppermost relief surface of the elastomeric relief element and the pattern of printable material composition is transferred from the uppermost relief surface to a surface of the receiver element.

In another embodiment, a laser forms the pixel features in the flexographic plate and a print roller transfers the printable material composition to a receiver element. The average area of the single raised features formed in a line on the plate is less than an area circumscribed or encompassing the pixel features.

The following Examples are provided to illustrate the practice of this invention and are not meant to be limiting in any manner. The following materials and procedures were used in general for all of the Examples unless otherwise indicated. These Examples are carried out to provide printed patterns on a flexible polymeric substrate (coated or non-coated) using flexographic printing plate precursors prepared as described in U.S. Pat. No. 8,142,987 (noted above) each of which was imaged to provide a relief pattern in a flexographic printing plate as an elastomeric relief element, using a high resolution imaging device. A detailed description of the preparation of flexographic plates is included in U.S. Pat. No. 8,399,177, the disclosure of which is incorporated herein by reference. In the preparation of flexographic plates, it may also be useful to employ a double-sided UV exposure to cross-link the polymer on both sides of the plate material as described in U.S. Publication No. 2014/0047992 (Ramakrishnan), which is also incorporated herein by reference.

Each sample of Flexcel™ NX flexographic printing plate precursor having a 1.14 millimeter total thickness, was provided as an elastomeric relief element and imaged to provide a relief pattern having an uppermost relief surface and an average relief image depth of 250 μm containing grid features spaced 400 μm apart and a line width of 6 μm. Each elastomeric relief element was then mounted using 3M brand 1115 adhesive-backed tape onto the plate cylinder of a Mark-Andy Scout narrow web flexographic press and a web speed of 120 feet per minute was employed.

A specific ink (printable material composition), as described below and comprising a print material and a carrier liquid, was applied to the uppermost relief surface of each elastomeric relief element using a 1.4 BCM, 1200 lpi Anilox roller at a speed of 120 feet/minute and impression distance of 50 μm. Each ink had a viscosity of at least 100 cps at room temperature, and was applied to each elastomeric relief element. Each receiver element was a polymer-coated substrate composed of poly(ethylene terephthalate) (PET), Melinex 595 (DuPont Teijin). After the application of ink, it was dried using an Adphos NIR drying module.

The specific inks (printable material compositions) employed in the Examples described below included PChem Ink PFI-722, an aqueous based silver nanoink with a viscosity of about 500 centipoise obtained from PChem Associates (Bensalem, Pa.) and Flint Flexocure Force UV Flexo ink UFR8-DD71-465U from Flint Corp (Ann Arbor, Mich.).

The present invention will be directed in particular to elements forming part of, or in cooperation more directly with the apparatus in accordance with the present invention. It is to be understood that elements not specifically shown or described may take various forms well known to those skilled in the art.

As illustrated in FIG. 1, ink roller 30 was used to transfer printable material composition ("ink") 20 from ink pan 10 to Anilox inking system 40. The printable material composition 20 was then applied to the uppermost relief surface of elastomeric relief element 60 which was wrapped around plate cylinder 50. Receiver element 70 was brought into the apparatus on a suitable path 80 on roller 90, and then brought into contact with printable material composition 20 disposed on the uppermost relief surface of elastomeric relief element 60. Elastomeric relief element 60 was then separated from receiver element 70 after transferring the printable material composition 20 to receiver element 70. The arrows in FIG. 1 show the direction of path 80 as well as the direction of rotation of various components of the apparatus.

FIG. 2A illustrates the flow of printed ink (dark gray) on a transparent substrate transferred from an elastomeric relief element of the prior art with a fine grid line pattern comprising a series of small squares adjacent to one another side by side. The direction of ink flow (dark gray) in FIG. 2A is away from the printed pixel areas resulting in increased printed line width. FIG. 2B illustrates the flow of printed ink (dark gray) on a transparent substrate transferred from an elastomeric relief element according to one embodiment of the present invention, in which the fine line grid pattern comprise a series of small squares adjacent to one another vertex to vertex. The direction of ink flow (dark gray) in FIG. 2B is between the printed pixel areas resulting in a narrower line width. FIG. 2C is a schematic illustration of an embodiment of a continuous, connected fine pixel line pattern on an elastomeric relief element useful for carrying out the method of the present invention. With this element, most of the ink flow will be directed between the pixels resulting in a continuous line. FIG. 2D is a schematic illustration of an embodiment of a discontinuous, connected fine pixel line pattern on an elastomeric relief element useful for carrying out the method of the present invention. This element will also cause most of the ink flow to be directed between the pixels resulting in a continuous line.

FIG. 3A illustrates a fine grid line pattern for an elastomeric relief element, in which the fine lines comprise a series of small squares adjacent to one another side by side according to the prior art. FIG. 3B exemplifies a fine grid line pattern for an elastomeric relief element, in which the fine lines comprise a series of small diamonds adjacent to one another vertex to vertex according to one embodiment of the present invention.

FIG. 4A exemplifies a printed ink line pattern using the previously described PChem silver nanoink on a transparent substrate using an elastomeric relief element of the prior art, as illustrated in FIG. 3A. FIG. 4B exemplifies a printed ink line pattern also using the PChem ink on a transparent substrate using an elastomeric relief element useful for carrying out the method of the present invention, as illustrated in FIG. 3B.

FIG. 5A is a schematic illustration of an embodiment of a two pixel overlapping line bitmap pattern on an elastomeric relief element of the prior art.

FIGS. 5B through 5E are schematic illustrations of embodiments of two pixel non-overlapping bitmap line patterns on elastomeric relief elements useful for carrying out the method of the present invention. As shown in FIG. 5C, cluster 100 includes a vertex 105 and reference numeral 110 represents a cluster adjacent to cluster 100. As also shown in FIG. 5C, vertex 115 is adjacent to vertex 105. As illustrated in FIG. 5E, vertices 125 of clusters 120 fall on a line 130 and it can be seen that the vertices 125 of adjacent clusters 120 touch each other.

FIGS. 6A and 6B are schematic illustrations of an embodiments of three pixel overlapping line bitmap patterns on an elastomeric relief element of the prior art.

FIG. 6C is a schematic illustration of an embodiment of a three pixel non-overlapping line bitmap pattern on an elastomeric relief element useful for carrying out the method of the present invention.

Figure 7A:
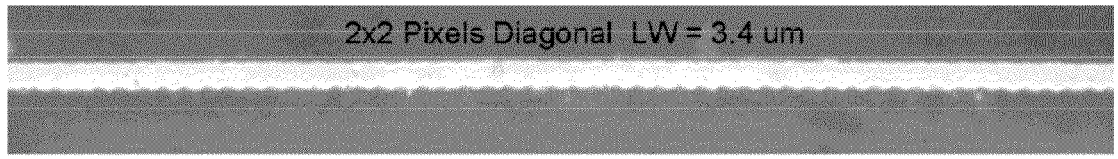
FIG. 7A is an electron micrograph of an elastomeric relief element of the prior art made using a two pixel overlapping bitmap pattern as illustrated in FIG. 5A.

FIG. 7A is an electron micrograph of an elastomeric relief element 7A of the prior art made using a two pixel overlapping bitmap pattern as illustrated in FIG. 5A. Note that the pixel features on the elastomeric relief element are not separated and form a continuous wavy line.

Figure 7B:
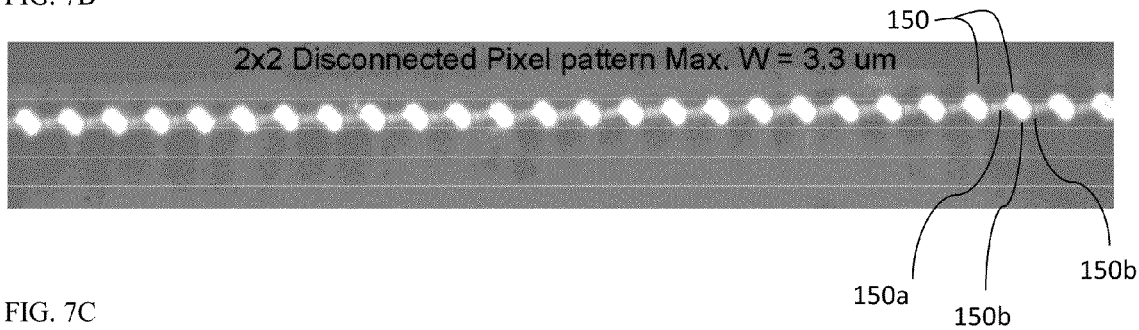
FIG. 7B is an electron micrograph of an elastomeric relief element of the present invention made using a two pixel non-overlapping bitmap pattern as illustrated in FIG. 5B.

FIG. 7B is an electron micrograph of an elastomeric relief element 7B of the present invention made using a two pixel non-overlapping bitmap pattern as illustrated in FIG. 5B. Note that the pixel features on the elastomeric relief element are discontinuous or non-adjacent. As shown in FIG. 7B, raised pixel features 150 are formed on the elastomeric relief element 60 such that a first width at portion 150b of raised pixel feature 150 which is distal to adjacent raised pixel features is greater than a second width at portions 150a and 150c of raised pixel feature 150 that are at locations proximate to adjacent raised pixel features.

Figure 7C:
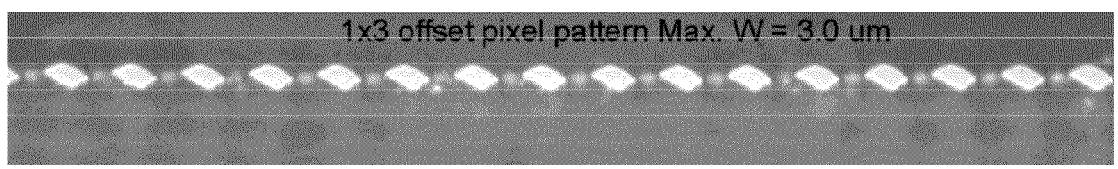
FIG. 7C is an electron micrograph of an elastomeric relief element of the present invention made using a two pixel non-overlapping bitmap pattern as illustrated in FIG. 5C.

FIG. 7C is an electron micrograph of an elastomeric relief element 7C of the present invention made using a two pixel non-overlapping bitmap pattern as illustrated in FIG. 5C. Note that the pixel features on the elastomeric relief element are discontinuous or non-adjacent.

Figure 7D:
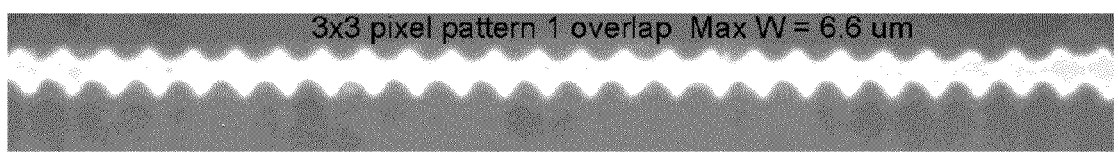
FIG. 7D is an electron micrograph of an elastomeric relief element of the prior art made using a three pixel overlapping bitmap pattern as illustrated in FIG. 6B.

FIG. 7D is an electron micrograph of an elastomeric relief element 7D of the prior art made using a three pixel overlapping bitmap pattern as illustrated in FIG. 6B. Note that the pixel features on the elastomeric relief element are not separated and form a continuous wavy line.

Figure 7E:
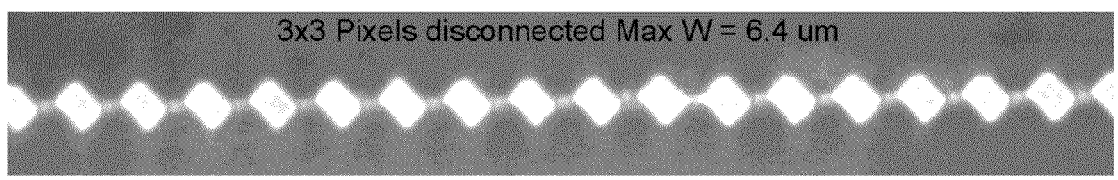
FIG. 7E is an electron micrograph of an elastomeric relief element of the present invention made using a three pixel non-overlapping bitmap pattern as illustrated in FIG. 6C.
Figure 8A:
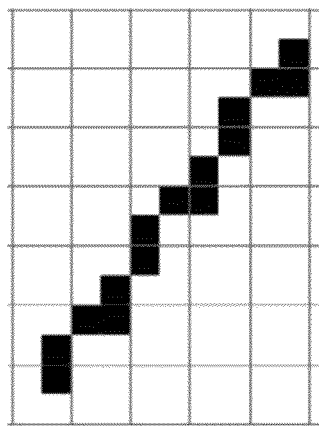
FIGS. 8A through 8G are schematic illustrations of additional embodiments of non-overlapping bitmap patterns used to image an elastomeric relief elements useful for carrying out the method of the present invention.
Figure 8B:
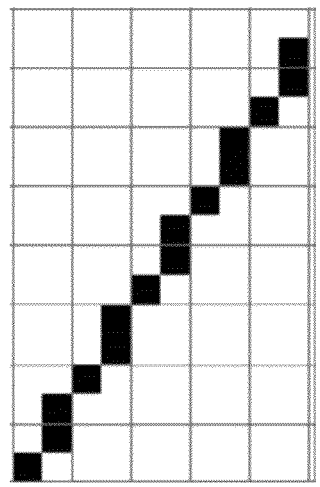
Figure 8C:
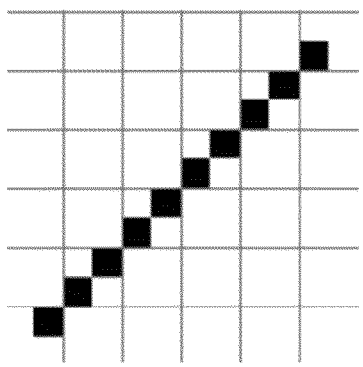
Figure 8D:
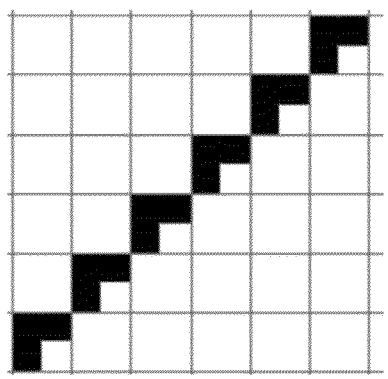
Figure 8E:
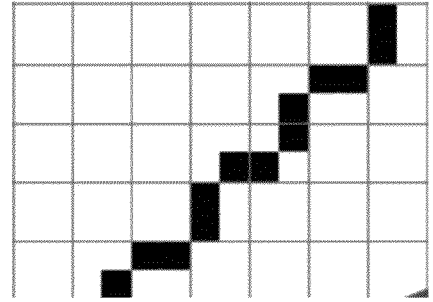
Figure 8F:
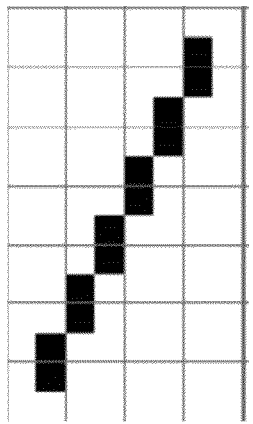
Figure 8G:
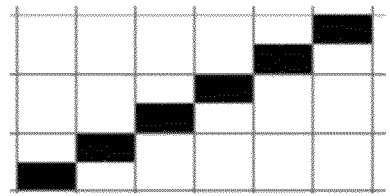

FIG. 7E is an electron micrograph of an elastomeric relief element 7E of the present invention made using a three pixel non-overlapping bitmap pattern as illustrated in FIG. 6C. Note that the pixel features on the elastomeric relief element are discontinuous or non-adjacent.

FIGS. 8A through 8G are schematic illustrations of additional embodiments of non-overlapping bitmap patterns used to image an elastomeric relief elements useful for carrying out the method of the present invention.

FIG. 9A is a schematic illustration of an embodiment of a non-overlapping bitmap pattern featuring a series of narrow lines with a 15 micron pitch used to image an elastomeric relief element useful for carrying out the method of the present invention.

FIG. 9B is a schematic illustration of an embodiment of a connected bitmap pattern featuring a series of narrow lines with a 15 micron pitch used to image an elastomeric relief element useful for carrying out the method of the prior art.

FIG. 9C is an optical micrograph at 100× magnification illustrating the narrow line printed ink patterns obtained with the non-overlapping bitmap pattern of FIG. 9A of the present invention.

FIG. 9D is an optical micrograph at 100× magnification illustrating the narrow line printed ink patterns obtained with the connected bitmap pattern of FIG. 9B of the prior art.

FIG. 9E is an optical micrograph at 400× magnification illustrating the narrow line printed ink patterns obtained with the non-overlapping bitmap pattern of FIG. 9A of the present invention.

FIG. 9F is an optical micrograph at 400× magnification illustrating the narrow line printed ink patterns obtained with the connected bitmap pattern of FIG. 9B of the prior art.

Figure 10A:
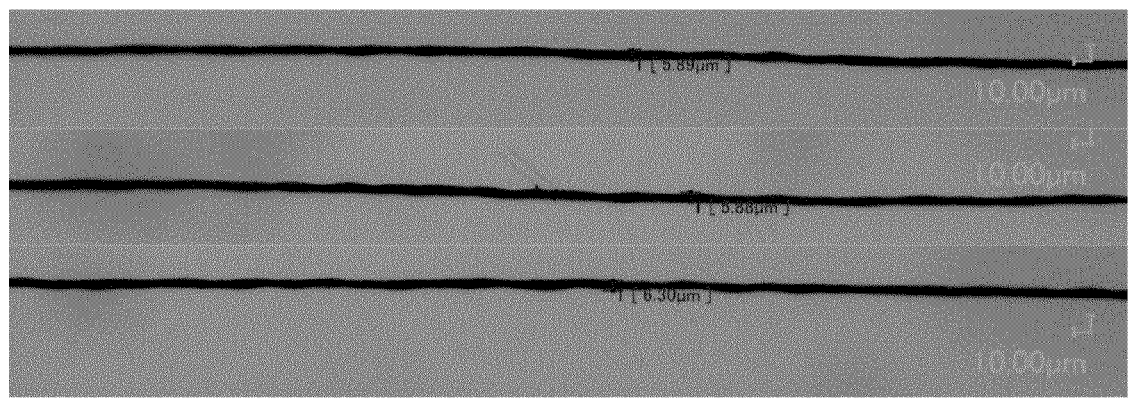
FIG. 10A is an optical micrograph at 400× magnification illustrating the narrow line patterns obtained with the connected bitmap pattern of FIG. 9B of the prior art.

FIG. 10A is an optical micrograph at 400× magnification illustrating the narrow line patterns obtained with the connected bitmap pattern of FIG. 9B of the prior art.

Figure 10B:
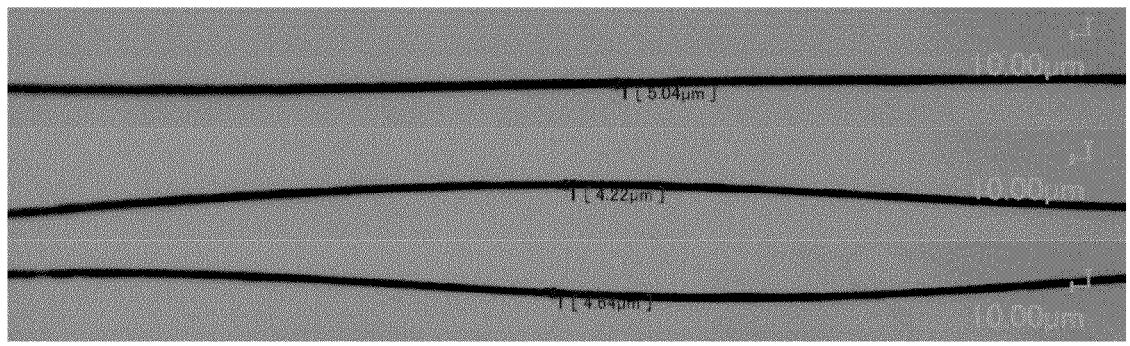
FIG. 10B is an optical micrograph at 400× magnification illustrating the narrow line patterns obtained with the non-overlapping bitmap pattern of FIG. 9A of the present invention.

FIG. 10B is an optical micrograph at 400× magnification illustrating the narrow line patterns obtained with the non-overlapping bitmap pattern of FIG. 9A of the present invention.

Figure 11A:
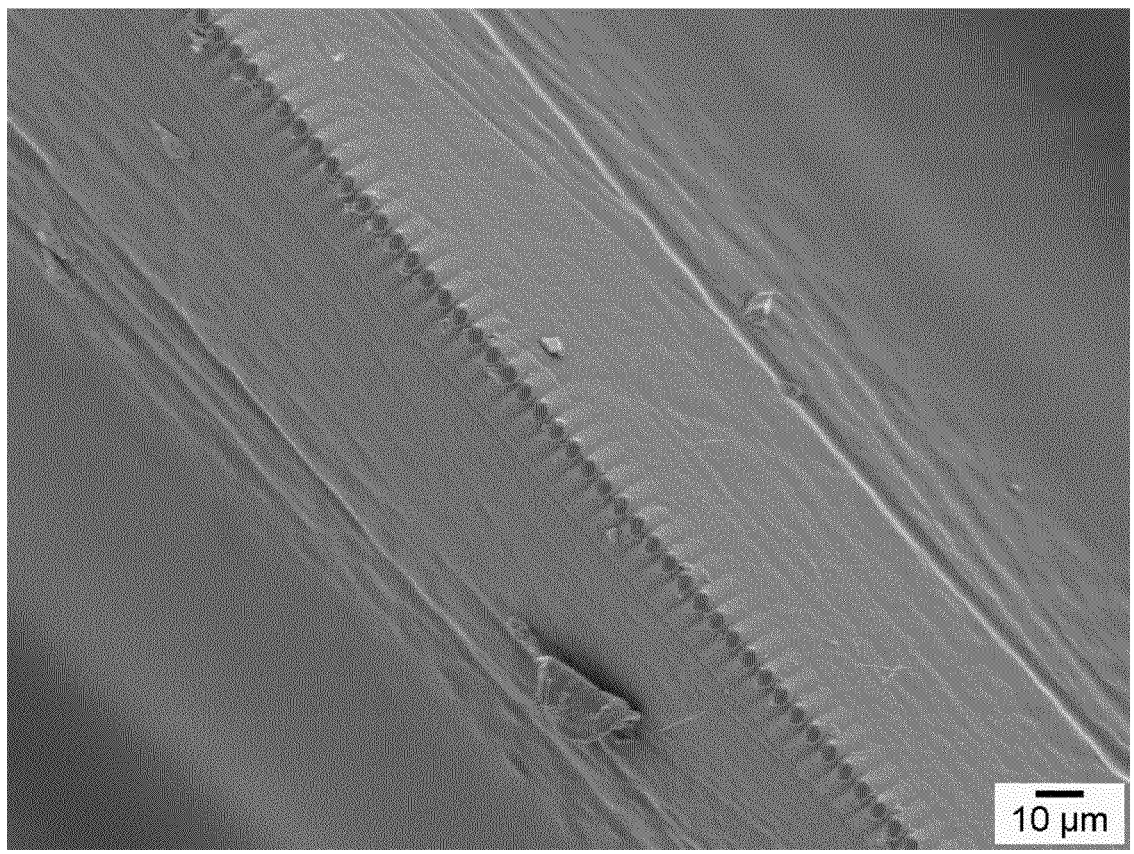
FIG. 11A is a scanning electron micrograph (500×, 0 degree tilt) of an elastomeric relief element of the present invention imaged with non-overlapping bitmap pattern.

FIG. 11A is a scanning electron micrograph (500×, 0 degree tilt) of an elastomeric relief element of the present invention imaged with non-overlapping diamond bitmap pattern.

Figure 11B:
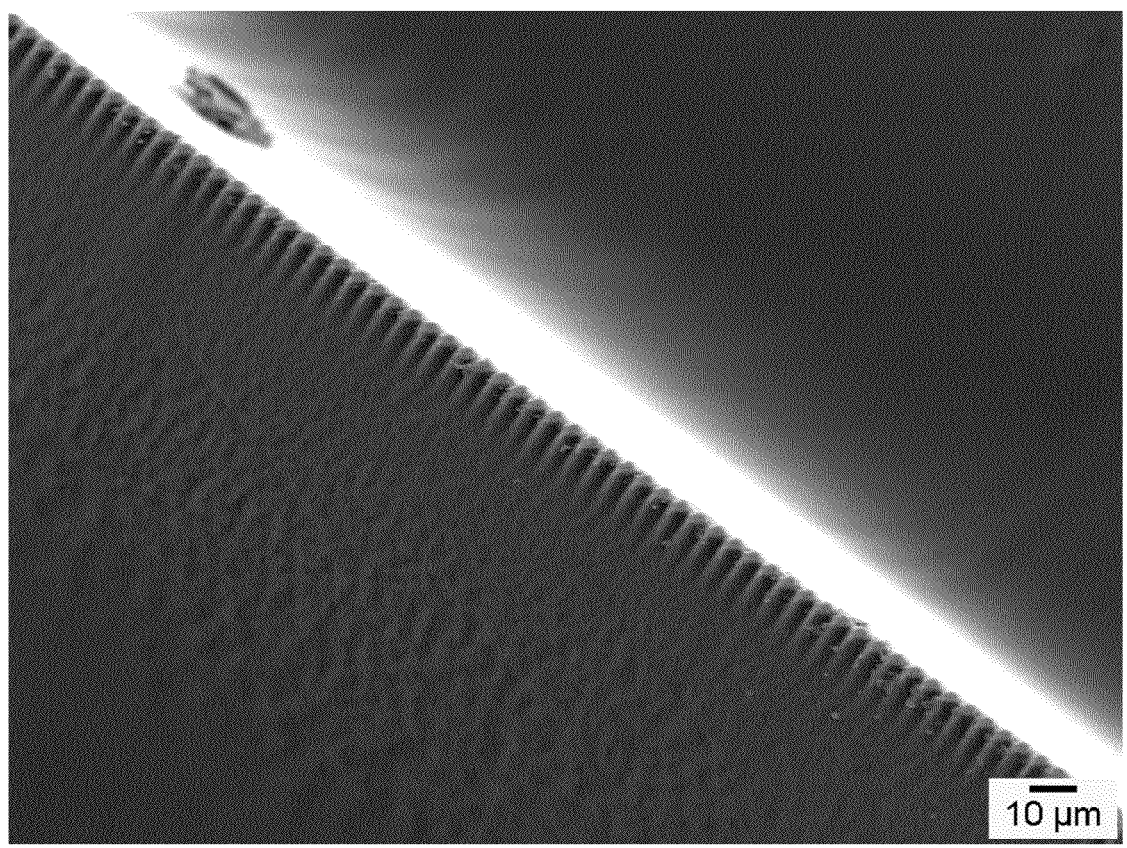
FIG. 11B is a scanning electron micrograph (500×, 45 degree tilt) of an elastomeric relief element of the present invention imaged with non-overlapping bitmap pattern.

FIG. 11B is a scanning electron micrograph (500×, 45 degree tilt) of an elastomeric relief element of the present invention imaged with non-overlapping diamond bitmap pattern.

Figure 11C:
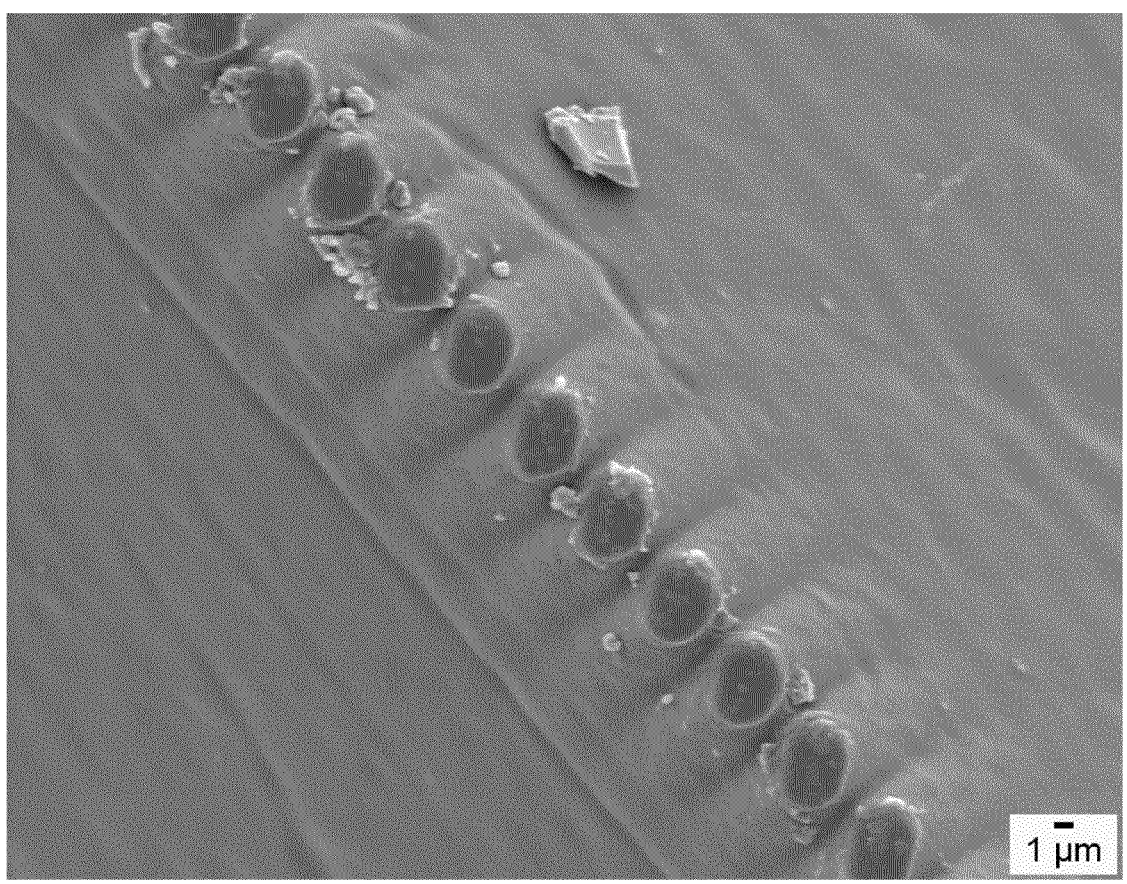
FIG. 11C is a scanning electron micrograph (2000×, 0 degree tilt) of an elastomeric relief element of the present invention imaged with non-overlapping bitmap pattern.

FIG. 11C is a scanning electron micrograph (2000×, 0 degree tilt) of an elastomeric relief element of the present invention imaged with non-overlapping diamond bitmap pattern.

Figure 11D:
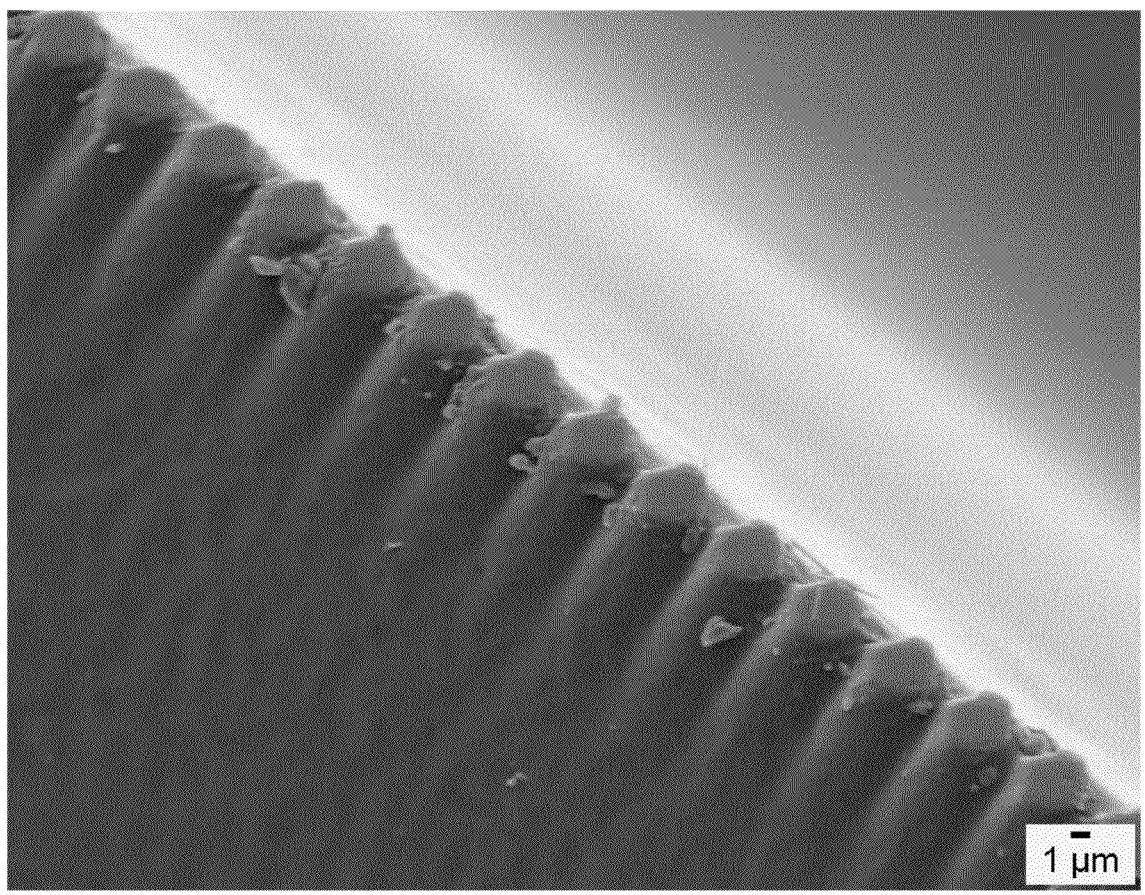
FIG. 11D is a scanning electron micrograph (2000×, 45 degree tilt) of an elastomeric relief element of the present invention imaged with non-overlapping bitmap pattern.

FIG. 11D is a scanning electron micrograph (2000×, 45 degree tilt) of an elastomeric relief element of the present invention imaged with non-overlapping diamond bitmap pattern.

Figure 11E:
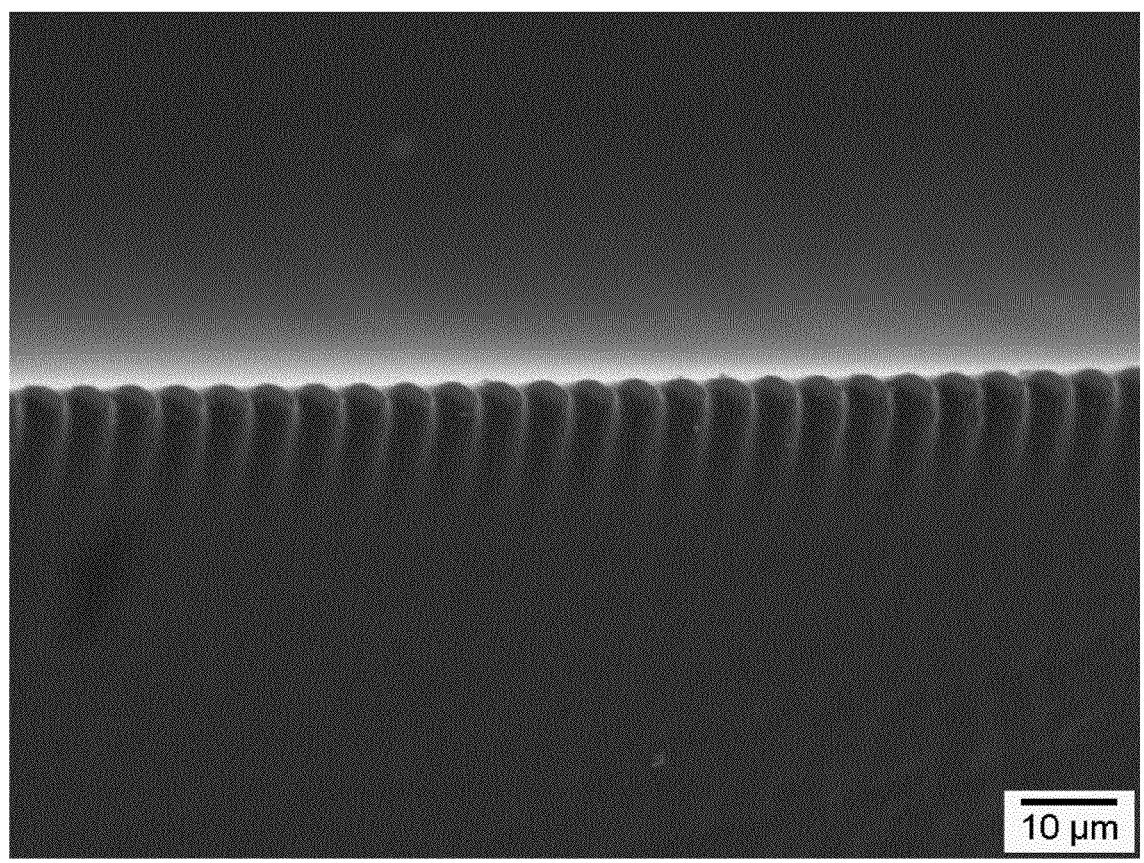
FIG. 11E is a scanning electron micrograph (1000×, 90 degree tilt) of an elastomeric relief element of the present invention imaged with non-overlapping bitmap pattern.

FIG. 11E is a scanning electron micrograph (1000×, 90 degree tilt) of an elastomeric relief element of the present invention imaged with non-overlapping bitmap pattern.

Figure 11F:
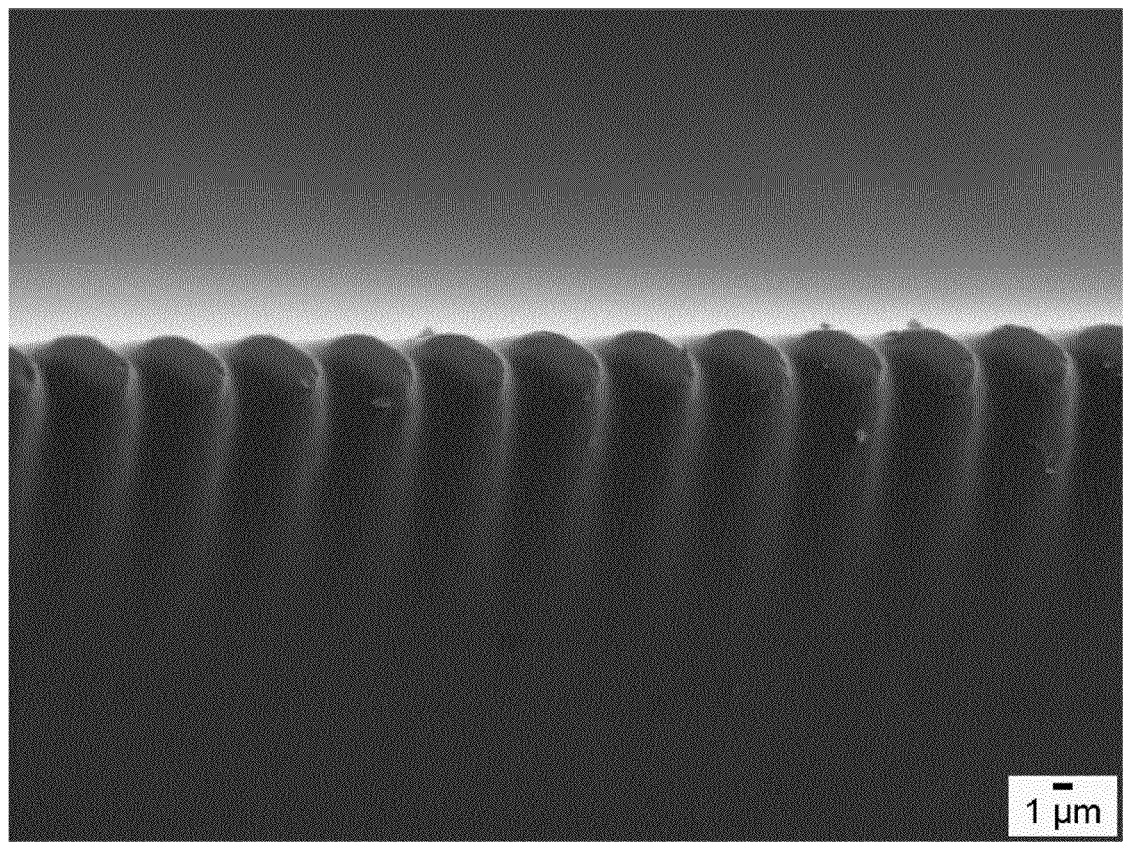
FIG. 11F is a scanning electron micrograph (2000×, 90 degree tilt) of an elastomeric relief element of the present invention imaged with non-overlapping bitmap pattern.

FIG. 11F is a scanning electron micrograph (2000×, 90 degree tilt) of an elastomeric relief element of the present invention imaged with non-overlapping bitmap pattern.

Note that the electron micrographs in FIGS. 11A to 11F clearly illustrate that the non-overlapping diamond bitmap patterns used to image the elastomeric relief element of the present invention result in a discontinuous relief structure on the imaged element.

EXAMPLE 1 (COMPARISON)

The general procedure described above was followed using a Flexcel™ NX flexographic printing plate precursor as an elastomeric relief element imaged to provide a relief line pattern shown in FIG. 3A. The resultant silver ink pattern printed using 2400 dpi imaging is shown in FIG. 4A and had an average line width of 25 microns.

EXAMPLE 2 (INVENTION)

The same procedure described in Example 1 was followed using a Flexcel™ NX flexographic printing plate precursor as an elastomeric relief element imaged to provide a relief line pattern shown in FIG. 3B. The resultant silver ink printed pattern shown in FIG. 4B had an average line width of 18 microns.

The elastomeric relief elements shown in FIGS. 7A through 7C featuring two pixel patterns were used to print narrow line patterns as described above. A non-conductive UV-curable black ink (Flint) was printed onto a transparent PET substrate and the resulting line widths obtained are given in TABLE I.

TABLE I

Printed Line Widths from Elastomeric Relief Elements (Two Pixels)

| Example No. | Element | Ink | Line Width (µm) |
|---|---|---|---|
| 3 (Comparison) | 7A | UV | 6.4 |
| 4 (Invention) | 7B | UV | 5.1 |
| 5 (Invention) | 7C | UV | 5.3 |

The elastomeric relief elements shown in FIGS. 7D and 7E featuring three pixel patterns were used to print narrow line patterns as described above. Resulting line widths obtained are given in TABLE II.

TABLE II

Printed Line Widths from Elastomeric Relief Elements (Three Pixels)

| Example No. | Element | Ink | Line Width (µm) |
|---|---|---|---|
| 6 (Comparison) | 7D | UV | 10.8 |
| 7 (Invention) | 7E | UV | 7.2 |

In each case, the elastomeric relief elements imaged using the non-overlapping bitmap patterns of the present invention and featuring discontinuous or non-adjacent pixel features resulted in finer printed line widths than those obtained with the overlapping bitmap patterns of the prior art, which featured continuous lines formed by adjacent connected pixel features.

EXAMPLE 8 (COMPARISON)

An elastomeric relief element was imaged using a bitmap pattern featuring a series of connected narrow lines with a 15 micron pitch as shown in FIG. 9B. The element was then used to print a UV curable black ink (Flint) as previously described and the resulting line patterns obtained are shown in FIGS. 9D and 9F. Note the ink pooling and the undesired wavy printed lines.

EXAMPLE 9 (INVENTION)

An elastomeric relief element was imaged using a bitmap pattern featuring a series non-overlapping pixels in a straight line with a 15 micron pitch as shown in FIG. 9A. The element was then used to print a UV curable black ink (Flint) as previously described and the resulting line patterns obtained are shown in FIGS. 9C and 9E. Note the improved printed line quality with less wavy lines and little ink pooling.

The invention has been described in detail with particular reference to certain preferred embodiments thereof, but it will be understood that variations and modifications can be effected within the scope of the invention.

PARTS LIST

10 ink pan
20 printable material composition
30 ink roller
40 anilox inking system
50 plate cylinder
60 elastomeric relief element
70 receiver element
80 path
90 roller
100 clusters
105 vertex
110 reference numeral
115 vertex
125 vertices
120 clusters
130 line
150 raised pixel features
150a-c portion

The invention claimed is:

1. A system for printing lines of no more than 20 microns on a receiver element comprising:
    a flexographic plate including an isolated row of pixel features, the pixel features comprising a series of adjacent clusters wherein a vertex of each cluster is adjacent to the vertex of an adjustment cluster;
    wherein the pixel features form a relief pattern of non-overlapping or discontinuous raised pixel features on the flexographic plate, and wherein a first width of the raised pixel features at a location that is distal to adjacent raised pixel features is greater than a second width of the raised pixel features at a location that is proximate to adjacent raised pixel features;
    an inking system for applying a printable material composition to the flexographic plate; and
    a print roller for transferring the printable material composition to the flexographic plate.

2. The system of claim 1 wherein a sum of an area of each pixel features in a line on the flexographic plate is less than an area circumscribed or encompassing the pixel features.

3. The system of claim 1 wherein the distance between consecutive pixel features is less than or equal to three pixel width.

4. The system of claim 1 wherein an average relief image depth of each pixel and each pixel features is at least 50 µm relative to an uppermost relief surface of the flexographic plate.

5. The system of claim 1 wherein the printable material composition has a viscosity of at least 10 cps to and including 2000 cps.

6. The system of claim 5 wherein the receiver element is non-porous.

7. The system of claim 1 comprises:
    wherein printable material composition from each adjacent clusters runs into the adjacent clusters to form the continuous lines when printed on a receiver.

8. The system of claim 1 wherein vertices of the clusters fall on a line.

9. The system of claim 1 wherein the vertices of clusters touch.

10. The system of claim 1 wherein the printable material composition is a catalyst ink or a conductive ink.

11. The system of claim 1 wherein lines of pixel features are straight lines or curved lines.

* * * * *